US009461231B2

(12) United States Patent
Savelli et al.

(10) Patent No.: US 9,461,231 B2
(45) Date of Patent: Oct. 4, 2016

(54) DIFFERENTIAL TEMPERATURE SENSOR

(71) Applicants: COMMISSARIAT À L'ENERGIE ATOMIQUE ET AUX ENERGIES ALTERNATIVES, Paris (FR); HOTBLOCK ONBOARD, Grenoble (FR)

(72) Inventors: Guillaume Savelli, Seyssins (FR); Joël Dufourcq, Puyoo (FR)

(73) Assignees: COMMISSARIAT À L'ENERGIE ATOMIQUE ET AUX ENERGIES ALTERNATIVES, Paris (FR); HOTBLOCK ONBOARD, Grenoble (FR)

(*) Notice: Subject to any disclaimer, the term of this patent is extended or adjusted under 35 U.S.C. 154(b) by 0 days.

(21) Appl. No.: 14/974,850

(22) Filed: Dec. 18, 2015

(65) Prior Publication Data
US 2016/0181501 A1  Jun. 23, 2016

(30) Foreign Application Priority Data

Dec. 19, 2014  (FR) ...................... 14 62971

(51) Int. Cl.
H01L 23/34 (2006.01)
H01L 35/32 (2006.01)
H01L 35/04 (2006.01)

(52) U.S. Cl.
CPC ............ *H01L 35/32* (2013.01); *H01L 35/04* (2013.01)

(58) Field of Classification Search
None
See application file for complete search history.

(56) References Cited

U.S. PATENT DOCUMENTS 6,046,398 A * 4/2000 Foote ................ H01L 35/18
136/201
9,039,280 B2 * 5/2015 Peroulis .................. G01K 7/34
374/183
2002/0037026 A1 * 3/2002 Sato .......................... G01J 5/02
374/132
2003/0152128 A1 * 8/2003 Verhaegen ............. G01K 7/028
374/30
2009/0205694 A1 * 8/2009 Huettner ................ H01L 35/30
136/201

(Continued)

FOREIGN PATENT DOCUMENTS

EP  1767913 A1  3/2007
FR  2598803 A1  11/1987
FR  2955708 A1  7/2011

(Continued)

OTHER PUBLICATIONS

Kimber et al. "Energy efficiency ensured through surface temperature and heat flow studies." Newcastle upon Tyne, GB. May 26, 1990. 2234 Strain. pp. 67-69.

(Continued)

*Primary Examiner* — Alexander Ghyka
(74) *Attorney, Agent, or Firm* — Oliff PLC

(57) ABSTRACT

This sensor (1) includes an assembly of thermoelectric layers, a support member (2) including at least one first and one second metallic connector pins (30, 31), first and second metal connectors arranged to electrically connect the support member (2) respectively to a first connection pad and a second connection pad, an external package (8) including a first surface (8a) and a second opposite surface (8b) intended to be respectively connected to a hot source and to a cold source, a first via (80) connecting the first surface (8a) to each first connector pin (30), a second via (81) connecting the second surface (8b) to each second connector pin (31), and the support member (2) includes thermal conductors between the connector pins (30, 31) and the metal connectors.

13 Claims, 8 Drawing Sheets

(56) References Cited

U.S. PATENT DOCUMENTS

| | | | | |
|---|---|---|---|---|
| 2011/0083713 | A1* | 4/2011 | Narducci | H01L 35/32 136/230 |
| 2011/0228809 | A1* | 9/2011 | Tadigadapa | G01K 7/32 374/31 |
| 2013/0081662 | A1* | 4/2013 | Dibra | H01L 35/32 136/203 |
| 2013/0202012 | A1* | 8/2013 | Peroulis | G01K 7/34 374/184 |
| 2014/0015089 | A1* | 1/2014 | Savelli | H01L 35/34 257/467 |

FOREIGN PATENT DOCUMENTS

| | | |
|---|---|---|
| WO | 84/02037 A1 | 5/1984 |
| WO | 2007/034048 A1 | 3/2007 |
| WO | 2011/012586 | 2/2011 |

OTHER PUBLICATIONS

Seok et al. "Micro heat flux sensor using copper electroplating in SU-8 microstructures." Institute of Physics Publishing. J. Micromech. Microeng. vol. 11 (2001). pp. 221-225.

* cited by examiner

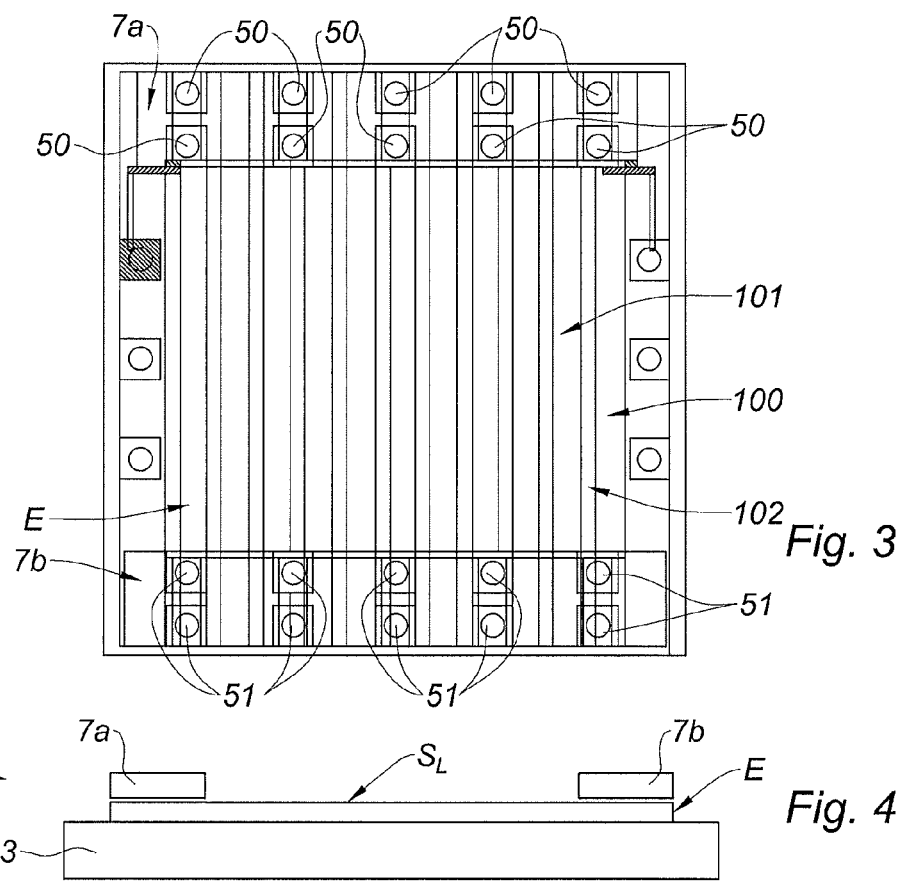
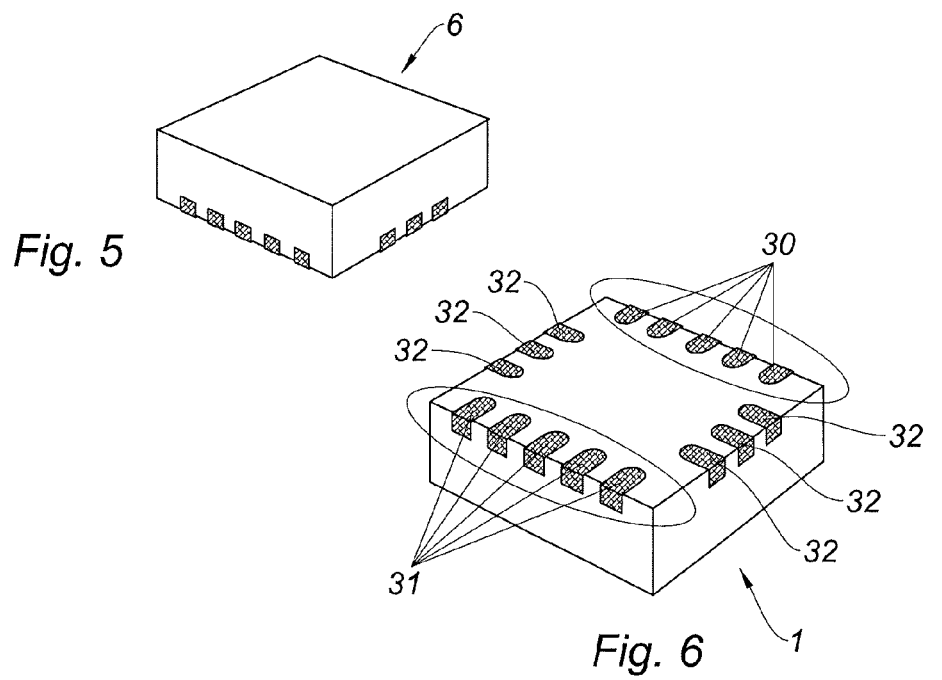

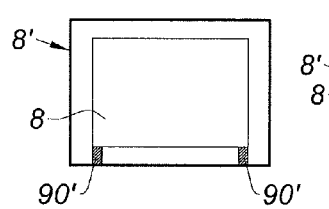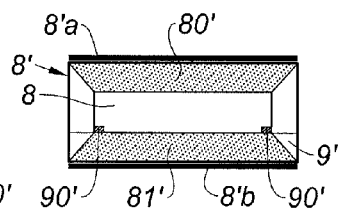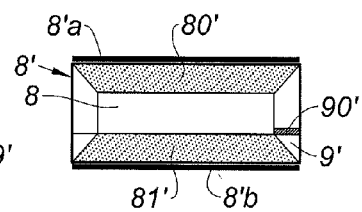
Fig. 21a    Fig. 21b    Fig. 21c
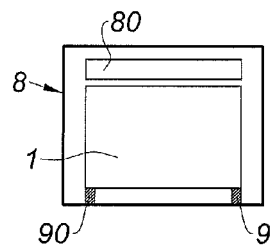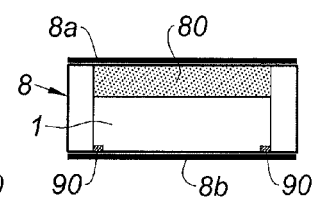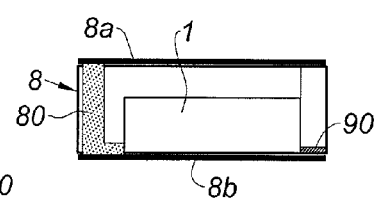
Fig. 22a    Fig. 22b    Fig. 22c
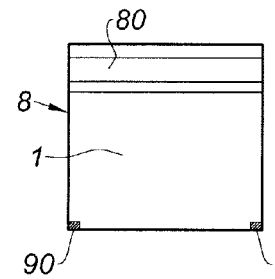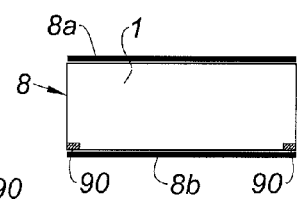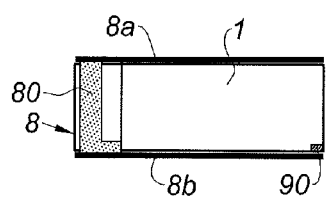
Fig. 23a    Fig. 23b    Fig. 23c
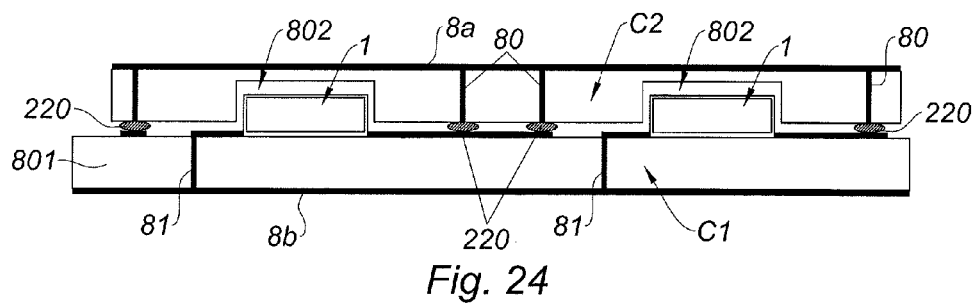
Fig. 24

DIFFERENTIAL TEMPERATURE SENSOR

TECHNICAL FIELD

The present invention relates to a differential temperature sensor. More specifically, it is a Seebeck effect thermoelectric sensor. The present invention also relates to a differential temperature measurement device comprising a plurality of such sensors.

BACKGROUND ART

As illustrated in FIG. 1, a known differential temperature sensor 1 between a hot source Sc and a cold source Sf of the state of the art comprises:
- a substrate (not shown), preferably made of a silicon-based material,
- an assembly of thermoelectric layers arranged on the substrate separated by a thermally-insulating material 102, the assembly comprising at least one first junction 10 of a thermocouple 100, 101 on one side of the assembly, called hot side, and at least one second junction 11 of thermocouple 100, 101 on the opposite side of the assembly, called cold side,
- at least one first and one second connection pads (not shown) arranged to transfer heat respectively to each first junction 10 and to each second junction 11.

Terms "hot" and "cold" are to be understood in relative fashion, that is, the temperature of the "hot" source is higher than the temperature of the "cold" source.

The connection pads are intended to be thermally connected to hot source Sc and to cold source Sf.

The assembly of thermoelectric layers comprises N thermocouples 100, 101, that is, N layers based on a first thermoelectric material 100 and N layers based on a second thermoelectric material 101. Each first junction 10 and each second junction 11 are formed with an electrically-conductive material.

Output voltage V generated by sensor 1 is provided by the following formula:

$$V = N \times (S_2 - S_1) \times (Tc - Tf), \text{ where:}$$

N is the number of thermocouples 100, 101,
$S_1$ and $S_2$ respectively are the Seebeck coefficient of the first and second thermoelectric materials 100, 101,
(Tc−Tf) is the thermal gradient applied between the hot side and the cold side of the assembly.

Such a sensor 1 of the state of the art forms a chip and falls within thin layer technologies, thus differing from macroscopic Seebeck effect thermoelectric sensors.

"Chip" means a wafer, preferably made of silicon, comprising an elementary component.

Such a sensor 1 of the state of the art is thus used in various applications where a miniaturization is desired. One can mention, as non-limiting examples, microelectronics, mobile telephony, smart homes, smart buildings, smart grids, or certain industrial processes.

Further, non-integrated planar sensors capable of measuring the temperature of a flow orthogonal to the substrate are known in the state of the art, particularly from documents WO 2007034048, FR 2955708, WO 8402037, and FR 2598803.

Currently, to achieve an electronic function, the integration of such a sensor 1 to other elementary components in a circuit is performed during the circuit manufacturing technological process. This solution is not satisfactory since it introduces complexity and multiple constraints for the execution of the method steps, which have to take into account the influence of adjacent elementary components.

Further, the direct integration of such a sensor 1 in a package, for example, an integrated circuit package, causes significant heat losses which affect the thermal gradient applied between the hot side and the cold side of the assembly, thus preventing sensor 1 from operating properly.

SUMMARY OF THE INVENTION

The present invention aims at overcoming all or part of the above-mentioned disadvantages, and relates for this purpose to a differential temperature sensor between a hot source and a cold source, the sensor comprising a substrate, an assembly of thermoelectric layers arranged on the substrate, the assembly comprising at least one first junction of a thermocouple on one side of the assembly, called hot side, and at least one second junction of the thermocouple on the opposite side of the assembly, called cold side, at least one first and one second connection pads arranged to transfer heat respectively to each first junction and to each second junction, the sensor being remarkable in that it comprises:
- a thermally-insulating support member arranged to support the substrate, the support member comprising at least one first and one second metal connector pins,
- first and second metal connection means arranged to electrically connect the support member respectively to the or each first connection pad and to the or each second connection pad,
- an external package enclosing the assembly of thermoelectric layers and the support member, the external package comprising a first surface and a second opposite surface intended to be respectively connected to the hot source and to the cold source, a first via connecting the first surface to each first connector pin, a second via connecting the second surface to each second connector pin, and in that the support member comprises heat transfer means arranged to transfer heat from each first connector pin to the first metal connection means, and to transfer heat from the second metal connection means to each second connector pin.

Thus, such a sensor according to the invention is directly integrated to the support member due to the first and second metal connection means. The metal connector pins of the support member enable to provide both:
- an electric connection of the support member, for example, to an electronic board,
- a good heat conduction between the hot and cold sources and the support member via the first and second vias.

The metallic nature of the first and second connection means enables to provide both:
- an electric connection of the support member to the connection pads,
- a good thermal conduction between the support member and the connection pads.

"Thermally insulating" means that the support member has a heat conductivity greater than a value in the order of 150 W/m/K.

"Thermally conductive" means an entity having a heat conductivity smaller than a value in the order of 150 W/m/K.

The support member is thermally insulating to avoid the forming of a thermal bridge between the first and second metal connection means via the support member. Thus, the thermal gradient between the hot source and the cold source may be transmitted between the first and second metal connection means, and thereby between the hot side and the cold side of the assembly of thermoelectric layers via the first and the second connection pads.

Further, thermal losses due to the integration are strongly decreased due to the heat transfer means and to the first and to the second metal connection means.

Further, the external package enables to measure temperature when the hot and cold sources are arranged on either side of the support member in a plane orthogonal to the substrate, and this, while keeping an integrated sensor-chip. "Sensor-chip" means the structure formed by the substrate, the assembly of thermoelectric layers, and the connection pads. The thickness of the external package and the first and second surfaces of the external package are adapted to the distance separating the hot and cold sources. The surfaces and vias of the external package transfer heat from the hot and cold sources to the support member.

Advantageously, the first and second surfaces of the external package are coated with a thermally-conductive material.

Thus, the heat transfer between the hot and cold sources and the vias is improved. The surfaces made thermally conductive and the vias transfer heat between the hot and cold sources and the support member.

According to an embodiment, the sensor comprises an encapsulation layer arranged on the support member to encapsulate the assembly of thermoelectric layers, the encapsulation layer being preferably made of a polymer-based material.

According to an embodiment, the sensor comprises an integrated circuit package enclosing the assembly of thermoelectric layers, the integrated circuit package comprising the support member, and the external package encloses the integrated circuit package.

Thus, such a sensor according to the invention is directly integrated to the integrated circuit package due to the first and second metal connection means. The thickness of the external package and the first and second surfaces of the external package are adapted to the distance separating the hot and cold sources, while the dimensions of the integrated circuit package can be fixed. Further, the integrated circuit package enables to encapsulate the assembly of thermoelectric layers.

Advantageously, the integrated circuit package comprises at least one electric connector pin, and the external package comprises at least one electric track extending from the electric connector pin.

Thus, such an electric track enables to define an electric output for the external package.

Advantageously, the external package comprises a support member arranged to support the integrated circuit package.

Thus, the support member of the external package enables to improve the mechanical behavior of the sensor.

According to an embodiment, the first and the second metal connection means comprise a solder bump respectively soldered onto the or each first connection pad and onto the or each second connection pad to assemble the substrate and the support member.

Thus, such metallic solder bumps have excellent heat conduction properties.

According to an alternative execution, the first and the second metal connection means comprise a bonding wire respectively welded to the or each first connection pad and to the or each second connection pad to assemble the substrate and the support member.

According to an embodiment, the heat transfer means comprise:

at least one first metal track connecting the first connection means to the or each first metal connector pin,
at least one second metal track connecting the second connection means to the or each second metal connector pin.

Thus, such metal tracks may be given a pattern in the support member so as to:
avoid a thermal bridge between the hot side and the cold side of the assembly,
provide an electric connection,
provide a good thermal conduction between the metal connector pins and the corresponding connection means,
maintain a good mechanical behavior of the tracks.

Advantageously, the assembly of thermoelectric layers has a free surface, and the sensor comprises a first and a second thermally-conductive elements facing said free surface and extending at a distance from said free surface, and respectively continuing said assembly on the hot side and on the cold side.

Thus, such thermally-conductive elements enable to homogenize the heat transfer between the hot side and the cold side of the assembly of thermoelectric layers.

Advantageously, the sensor comprises a dielectric layer interposed between the substrate and the assembly of thermoelectric layers.

Thus, such a dielectric layer enables to electrically and thermally insulate the substrate.

According to an embodiment, the substrate is made of a silicon-based material.

According to an alternative execution, the substrate is made of a thermally-insulating material, such as glass or quartz.

The present invention also relates to a differential temperature measurement device, comprising:
a plurality of sensors according to the invention,
a first printed circuit, the support member of each sensor being formed on the first printed circuit,
a second printed circuit arranged opposite the first printed circuit so that the first and second printed circuits form the external package enclosing the assembly of thermoelectric layers and the support member of each sensor.

Thus, such a device according to the invention enables to simultaneously measure the temperature of different mediums.

BRIEF DESCRIPTION OF THE DRAWINGS

The foregoing and other features and advantages will be discussed in detail in the following non-limiting description of different embodiments of a sensor and of a device according to the invention, in connection with the accompanying drawings, among which:

FIG. 3 is a partial simplified top view of a sensor according to an embodiment of the invention, FIG. 4 is a partial simplified side view of the embodiment illustrated in FIG. 3, FIG. 5 is a simplified perspective view of an integrated circuit package capable of integrating a sensor according to the invention, FIG. 6 is a simplified perspective view of the flipped package illustrated in FIG. 5, FIGS. 21a to 21c are top and cross-section views of a sensor according to an embodiment of the invention, FIGS. 22a to 22c are top and cross-section views of a sensor according to an embodiment of the invention, FIGS. 23a to 23c are top and cross-section views of a sensor according to an embodiment of the invention, FIG. 24 is a cross-section view of a device according to the invention.

Figure 1:
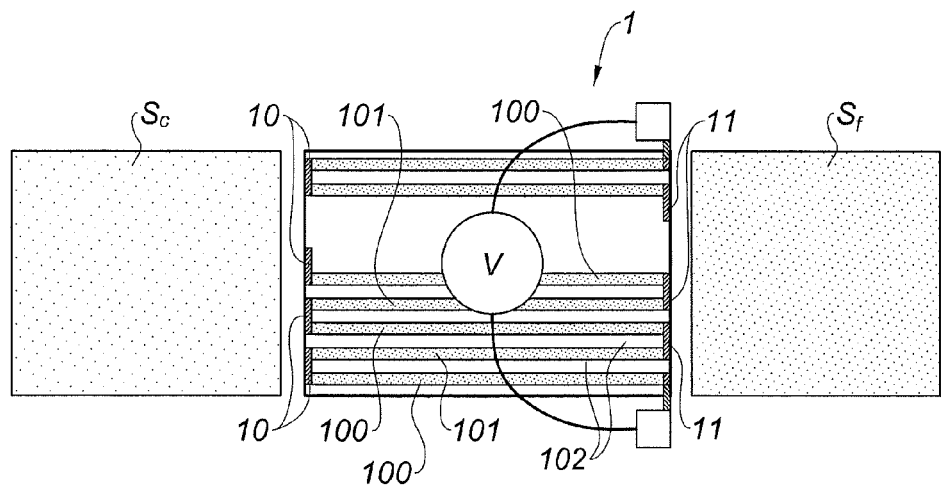
FIG. 1 is a simplified top view of a sensor of the state of the art (already discussed)

For the different embodiments, the same references will be used for identical elements or elements performing the same function, to simplify the description. The technical characteristics described hereafter for different embodiments are to be considered separately or according to any technically possible combination.

DETAILED DESCRIPTION OF THE EMBODIMENTS

FIGS. 2 to 23c illustrates a differential temperature sensor 1 between a hot source Sc and a cold source Sf, sensor 1 comprising:
- a substrate 3 (shown in FIG. 4),
- an assembly E of thermoelectric layers arranged on substrate 3 (assembly E and substrate 3 being schematically shown as a rectangle in FIGS. 2 and 7 to 9), assembly E comprising at least one first junction 10 of a thermocouple 100, 101 on one side of assembly E, called hot side, and at least one second junction 11 of thermocouple 100, 101 on the opposite side of assembly E, called cold side,
- at least one first and one second connection pads 50, 51 arranged to transfer heat respectively to each first junction 10 and to each second junction 11.

Sensor 1 further comprises:
- a thermally-insulating support member 2 arranged to support substrate 3, support member 2 comprising at least one first and one second metal connector pins 30, 31,
- first and second metal connection means arranged to electrically connect support member 2 respectively to the or each first connection pad 50 and to the or each second connection pad 51,
- an external package 8 enclosing assembly E of thermoelectric layers and support member 2, external package 8 comprising:
  - a first surface 8a and a second opposite surface 8b intended to be respectively connected to hot source Sc and to cold source Sf,
  - a first via 80, preferably metallic, connecting the first surface to each first connector pin 30,
  - a second via 81, preferably metallic, connecting the second surface to each second connector pin 31.

First metal connection means include a first metal connector configured to electrically connect support member 2 to the at least one first connection pad 50. Second metal connection means include a second metal connector configured to electrically connect support member 2 to the at least one second connection pad 51.

Support member 2 comprises heat transfer means arranged to transfer heat from each first connector pin 30 to the first metal connection means, and to transfer heat from the second metal connection means to each second connector pin 31. Heat transfer means include a first thermal conductor configured to transfer heat from the at least one first connector pin 30 to the first metal connector. Heat transfer means include a second thermal conductor configured to transfer heat from the second metal connector to the at least one second connector pin 31.

Terms "hot" and "cold" are to be understood in relative fashion, that is, the temperature of the "hot" source is higher than the temperature of the "cold" source.

Hereafter, the structure formed by substrate 3, assembly E of thermoelectric layers, and connection pads 50, 51 will be called "sensor-chip".

"Chip" means a substrate-forming wafer, preferably made of a silicon-based material, comprising an elementary component.

Substrate 3 is advantageously planar. Substrate 3 advantageously has a thickness in the range from 100 to 200 μm to limit the heat transfer to substrate 3. Further, the direction extending across the thickness of substrate 3 is called "first direction".

Assembly E of thermoelectric layers comprises N thermocouples 100, 101, that is, N layers based on a first thermoelectric material 100 and N layers based on a second thermoelectric material 101. First thermoelectric material 100 is advantageously electrically doped according to a first conductivity type. Second thermoelectric material 101 is advantageously doped according to a second conductivity type. Each first junction 10 and each second junction 11 are formed with an electrically-conductive material. The thermoelectric layers are separated by a thermally-insulating material 102. The N thermocouples 100, 101 and thermally-insulating material 102 are juxtaposed along a direction perpendicular to the first direction.

Figure 8:
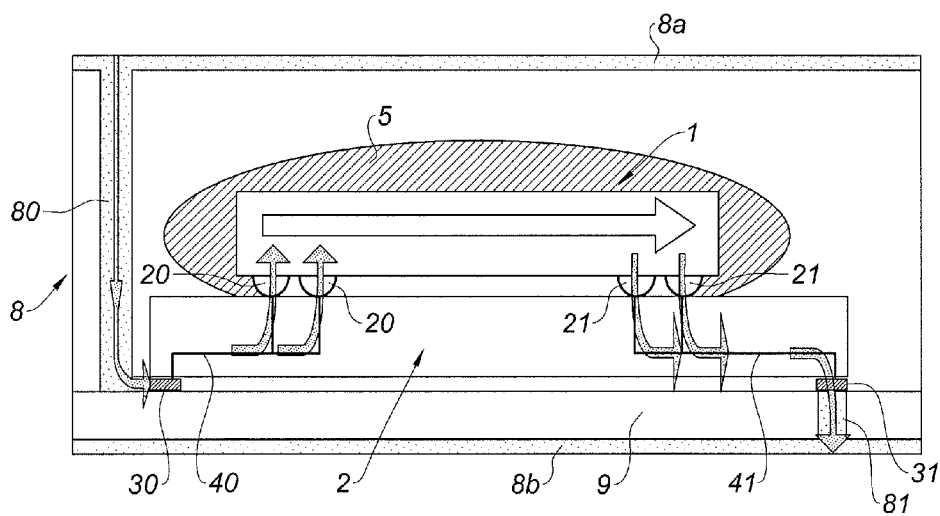
FIG. 8 is a simplified view of a sensor according to an embodiment of the invention.
Figure 9:
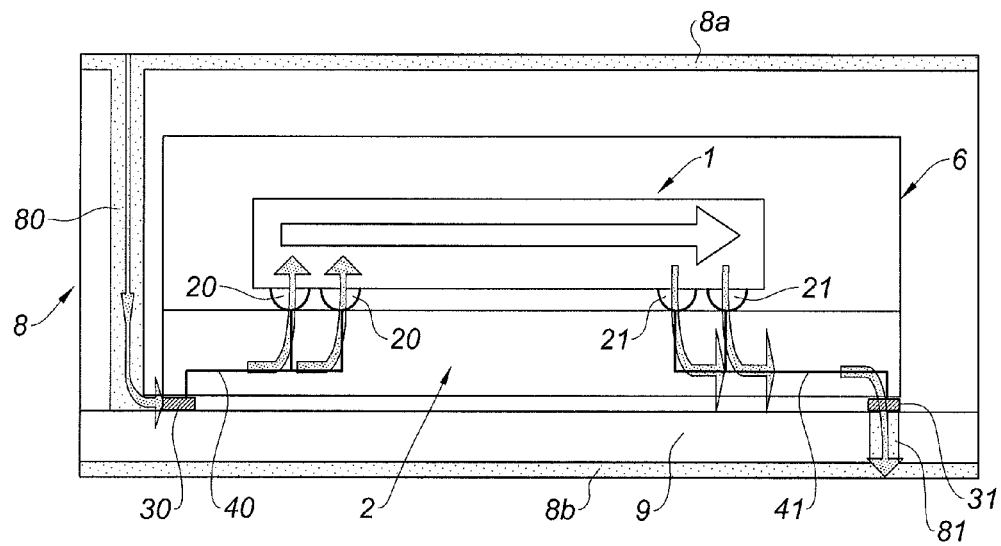
FIG. 9 is a simplified view of a sensor according to an embodiment of the invention.
Figure 10:
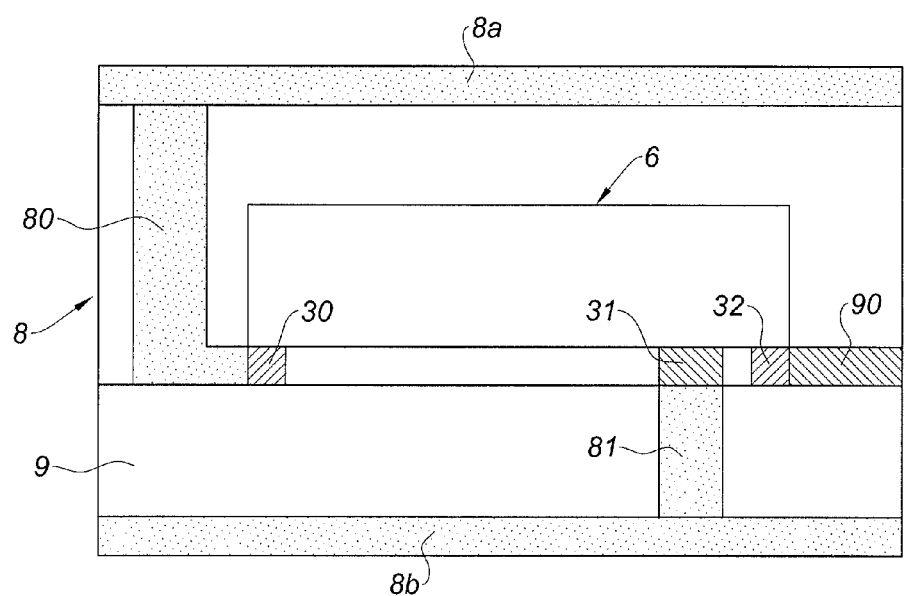
FIG. 10 is a simplified view of a sensor according to an embodiment of the invention.

In the embodiment illustrated in FIG. 8, sensor 1 comprises an encapsulation layer 5 arranged on support member 2 to encapsulate assembly E of thermoelectric layers. Encapsulation layer 5 is preferably made of a polymer-based material.

According to an alternative embodiment, sensor 1 comprises an integrated circuit package 6 enclosing assembly E of thermoelectric layers, integrated circuit package 6 comprising support member 2. External package 8 encloses integrated circuit package 6.

As a non-limiting example, integrated circuit package 6 may be of SMD type (Surface Mounted Device). Package 6 is preferably made of a thermally-insulating material. Package 6 preferably has a thickness in the range from 0.1 to a few mm. Package 6 preferably has no central metallic surface conventionally used as a heat sink to avoid adversely affecting the heat transfer between package 6 and the sensor chip.

As illustrated in FIG. 6, package 6 advantageously comprises:
a row of first metal connector pins 30 connected to first metal tracks 40, first metal tracks 40 forming heat transfer means arranged to transfer heat from each first connector pin 30 to the first metal connection means,
a row of second metal connector pins 31 connected to second metal tracks 41, second metal tracks 41 forming heat transfer means arranged to transfer heat from the second metal connection means to each second connector pin 31.

The rows of connector pins 30, 31 may be continuous to form connector bars. Package 6 comprises rows of additional metal connector pins 32 which are not used as heat transfer means. Additional metal connector pins 32 are used as simple electric connectors. The sensor-chip may comprise electric connection pads electrically connected to each first junction 10 and to each second junction 11. Connector pins 32 may be electrically connected to said electric connection pads. It will be within the abilities of those skilled in the art to select different layouts for the connector pins 30, 31 used as heat transfer means, and for the connector pins 32 used as electric connectors. The different layouts will be selected, in particular, according to the envisaged application, to the positioning of hot and cold sources Sc, Sf and to the connector elements for the integration of the sensor-chip. It is also possible to use at least one metal connector pin both as an electric connector and as heat transfer means.

In an embodiment, the first metal connection means comprise a solder bump 20 soldered to each first connection pad 50. The second metal connection means comprise a solder bump 21 soldered to each second connection pad 51. Solder bumps 20, 21 further enable to assemble substrate 3 and support member 2. For this purpose, sensor 1 may comprise additional solder bumps 22 (shown in FIG. 2) which are not electrically connected to connection pads 50, 51 but contribute to assembling substrate 3 with support member 2 to improve the mechanical behavior. Solder bumps 20, 21, 22 are preferably based on a material selected from the group comprising Au, SnAgAu, SnAgCu. Solder bumps 20, 21, 22 advantageously have a diameter in the order of 80 μm for a thickness in the order of 80 μm. Such dimensions enable to associate compactness and a sufficient heat transfer surface area for the functionality of sensor 1. Of course, the diameter and the thickness of solder bumps 20, 21, 22 may vary, for example, from a few tens to a few hundreds of micrometers. Substrate 3 and support member 2 belonging to package 6 are advantageously assembled by the flip-chip method, known by those skilled in the art, when the metal connection means comprise solder bumps 20, 21, 22. Substrate 3 and support member 2 belonging to package 6 are advantageously assembled by the wire bonding method, known by those skilled in the art, when the metal connection means comprise welded bonding wires.

First metal tracks 40 connect solder bumps 20 to first connector pins 30. Second metal tracks 41 connect solder bumps 21 to second connector pins 31.

Figure 7:
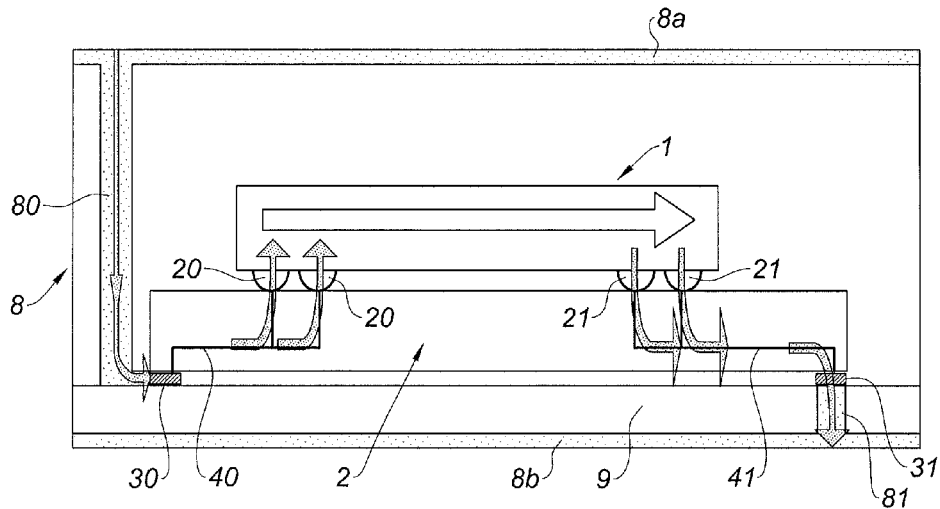
FIG. 7 is a simplified view of a sensor according to an embodiment of the invention.

The arrows of FIG. 7 indicate the direction of the heat transfer within sensor 1. Metal tracks 40, 41 may be formed through support member 2. Such metal tracks 40, 41 are given a pattern within support member 2 so as to:
avoid a thermal bridge between the hot side and the cold side of assembly E,
provide an electric connection,
provide a good thermal connection between connector pins 30, 31 and solder bumps 20, 21,
maintain a good mechanical behavior of the tracks.

To achieve this, as a non-limiting example, such metal tracks 40, 41 may have a thickness in the order of a few tens of nm for a thickness of support member 2 in the order of 100 nm.

First surface 8a and second opposite surface 8b of external package 8 are advantageously coated with a thermally-conductive material, and are intended to be respectively connected to hot source Sc and to cold source Sf. The connection may be direct, that is, first and second surfaces 8a, 8b are respectively in direct contact with hot source Sc and cold source Sf. The connection may be indirect, that is, surfaces 8a, 8b are thermally connected to said sources Sc, Sf via a thermal path. External package 8 is preferably made of a thermally-insulating material. Surfaces 8a, 8b are made thermally conductive, preferably by means of a coating based on a thermally-conductive material. The thermally-conductive material of the coating may be a metal such as Cu, Au, Ag, or an alloy based on silver, or a material selected from the group comprising anodized Al, SiC, AlN. The thermally-conductive material of the coating may be deposited on external package 8 according to different techniques such as chemical vapor deposition (CVD) or physical vapor deposition (PVD). The thermally-conductive material of the coating may be welded or soldered to external package 8. External package 8 advantageously comprises a support member 9 arranged to support integrated circuit package 6 inside of external package 8. Integrated circuit package 6 is advantageously fastened to support member 9 of external package 8 by gluing, soldering, or welding. Support member 9 of external package 8 comprises ports formed therein to receive second vias 81. External package 8 is advantageously made of a thermally-insulating material to avoid the forming of a thermal bridge between first via 80 and second via 81 via support member 9 of external package 8. Thus, the thermal gradient between hot source Sc and cold source Sf may be transmitted between each first connector pin 30 and each second connector pin 31, and thereby between the hot side and the cold side of assembly E of thermoelectric layers. The enclosure defined by external package 8 may advantageously be placed under vacuum to concentrate the heat transfer on vias 80, 81.

Since first via 80 may be close to cold source Sf, it is necessary to properly geometrically configure first via 80 as well as support member 9 of external package 8. To achieve this, the following equation should be verified:

$$\phi = \frac{e_{supp} \times \lambda_{avia} \times S_{via}}{\lambda_{supp} \times S_{supp} \times e_{via}} \gg 1$$

where:
$e_{supp}$ is the thickness of support member 9 of external package 8,
$e_{via}$ is the thickness of first via 80, $\lambda_{supp}$ is the thermal conductivity of support member 9 of external package 8, $\lambda_{via}$ is the thermal conductivity of first via 80, $S_{supp}$ is the lateral thermal conduction surface area of support member 9 of external package 8, $S_{via}$ is the lateral thermal conduction surface area of first via 80.

"Lateral" means a direction parallel to the first direction, that is, the direction extending across the thickness of substrate 3.

As a non-limiting example, the following table gathers parameters enabling to properly geometrically configure first via 80 as well as support member 9 of external package 8:

| Parameter | |
|---|---|
| $e_{supp}$ | 200 μm |
| $e_{via}$ | 700 μm |
| $\lambda_{supp}$ | 0.2 W/m/K (epoxy resin) |
| $\lambda_{via}$ | 386 W/m/K (Cu) |
| $S_{supp}$ | 5 × 5 mm² |
| $S_{via}$ | 3 × 1 mm² |
| Φ | 66 |

Vias 80, 81 are advantageously made of a thermally-conductive material. Vias 80, 81 are preferably metallic. Vias 80, 81 are advantageously made of a material based on copper or gold.

Vias 80, 81 may have different shapes. As illustrated in FIGS. 11*a* to 11*c* and 13*a* to 13*c*, vias 80, 81 may have a cross-section in the plane of substrate 3 of rectangular, square, or circular shape.

Figure 11A:
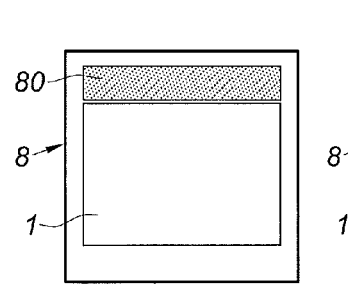
FIGS. 11a to 11c are simplified top views illustrating different embodiments of vias.
Figure 11B:
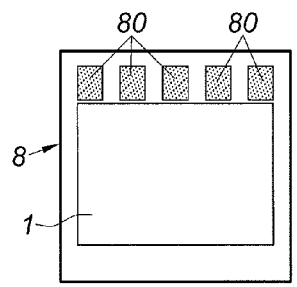
Figure 11C:
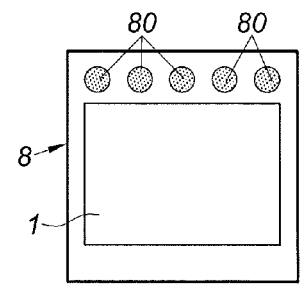
Figure 12A:
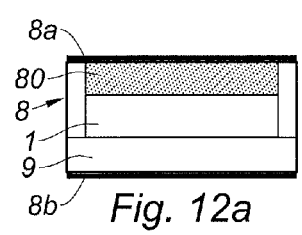
FIGS. 12a to 12c are simplified cross-section views of the embodiments illustrated in FIGS. 11a to 11c, FIGS. 13a to 13c are simplified top views of different embodiments of vias.
Figure 12B:
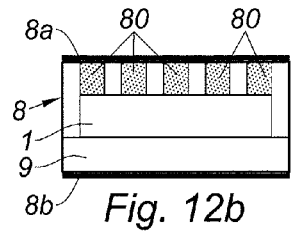
Figure 12C:
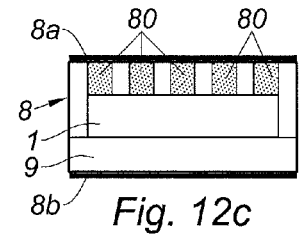
Figure 13A:
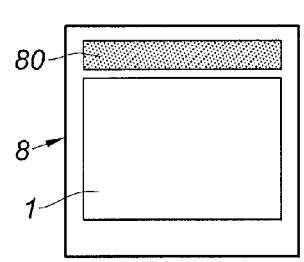
Figure 13B:
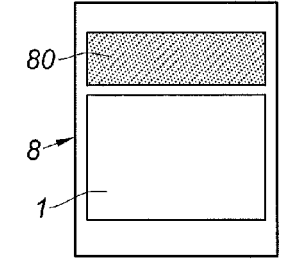
Figure 13C:
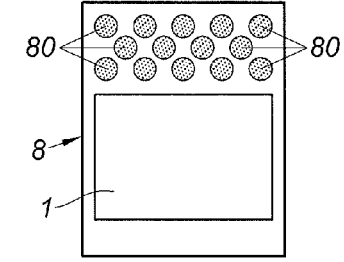
Figure 14A:
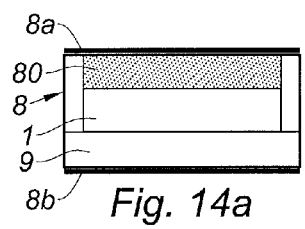
FIGS. 14a to 14c are simplified cross-section views of the embodiments illustrated in FIGS. 13a to 13c, FIGS. 15a to 15c are simplified cross-section views of the embodiments illustrated in FIGS. 13a to 13c, FIGS. 16a to 16c are simplified top views illustrating different positions of electric outputs of the external package.
Figure 14B:
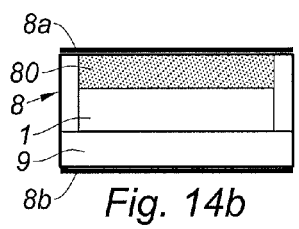
Figure 14C:
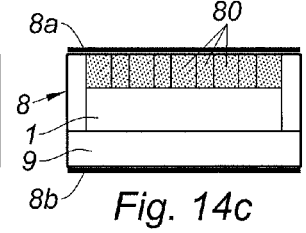
Figure 15A:
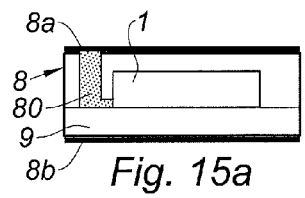
Figure 15B:
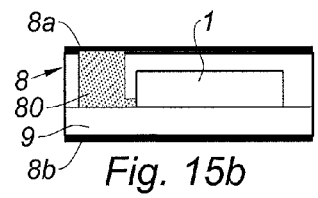
Figure 15C:
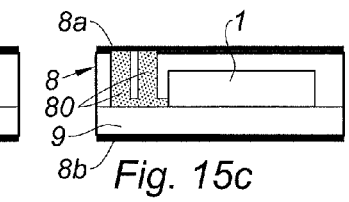

Vias 80, 81 may be one-piece (particularly illustrated in FIGS. 11*a* and 13*b*) or formed of a plurality of wells (particularly illustrated in FIGS. 11*b*, 11*c*, and 13*c*).

It should be noted that only the first vias 80 are shown in FIGS. 11*a* to 15*c* for simplicity. Of course, the described characteristics also apply to second vias 81.

According to an execution mode, vias 80, 81 are solid, that is, filled with a thermally-conductive material such as a metal. According to an alternative execution, vias 80, 81 are hollow, that is, hollowed at their center to form a thermally-conductive cylindrical wall, the cylindrical wall being preferably metallic.

Vias 80, 81 may be directly connected to connector pins 30, 31 or indirectly connected thereto via metal tracks. These different architectures of vias 80, 81 enable to modify parameters $e_{via}$ and $S_{via}$ so that $\Phi \gg 1$.

Integrated circuit package 6 advantageously comprises at least one electric connector pin 32 which is not used as heat transfer means. External package 8 advantageously comprises at least one electric track 90 extending from electric connector pin 32. It will be within the abilities of those skilled in the art to select different layouts for electric connector pins 32, particularly according to the envisaged application, and to the positioning of hot and cold sources Sc, Sf. Thus, it will be within the abilities of those skilled in the art to select different layouts for electric tracks 90 according to the layouts of said electric connector pins 32 to define different positions of electric outputs S for external package 8. The or each electric track 90 is advantageously formed in support member 9 of external package 8.

Figure 16A:
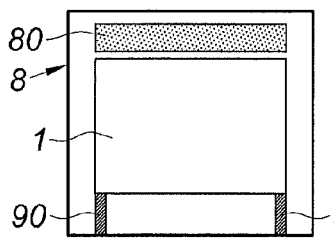
Figure 16B:
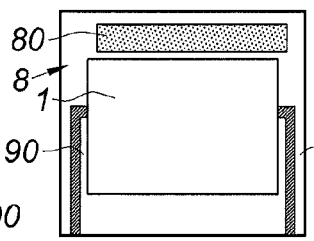
Figure 16C:
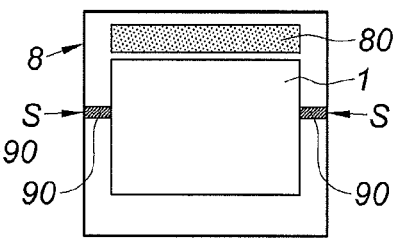
Figure 17A:
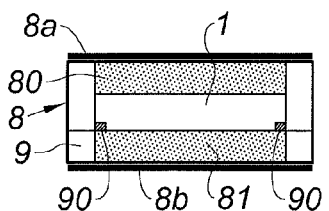
FIGS. 17a to 17c are simplified cross-section views for the positions illustrated in FIGS. 16a to 16c, FIGS. 18a to 18c are simplified cross-section views for the positions illustrated in FIGS. 16a to 16c, FIGS. 19a to 19c are top and cross-section views of a sensor according to an embodiment of the invention.
Figure 17B:
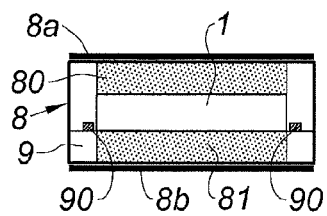
Figure 17C:
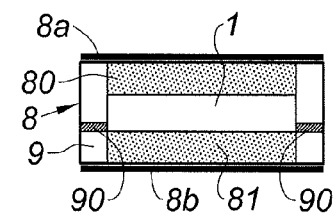
Figure 18A:
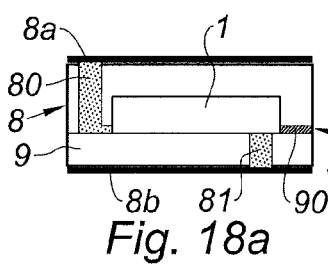
Figure 18B:
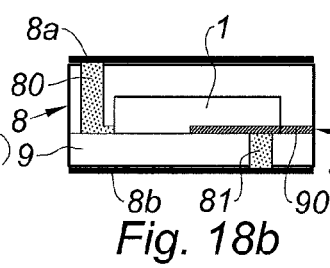
Figure 18C:
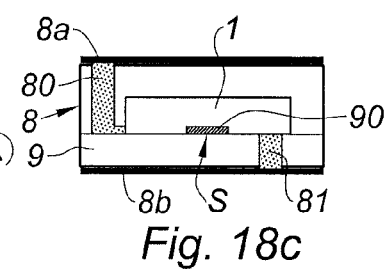
Figure 19A:
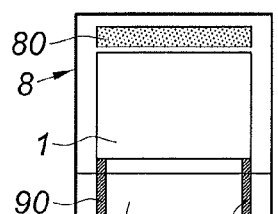
Figure 19B:
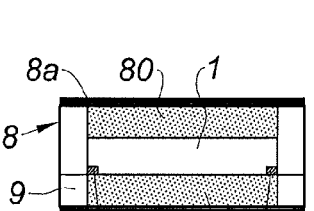
Figure 19C:
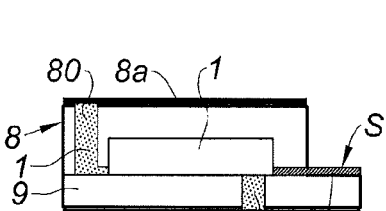
Figure 20A:
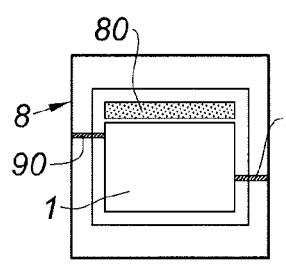
FIGS. 20a to 20c are top and cross-section views of a sensor according to an embodiment of the invention.
Figure 20B:
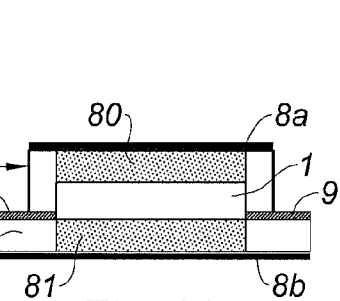
Figure 20C:
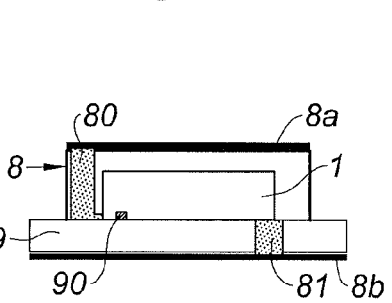

As non-limiting examples, FIGS. 16*a* to 16*c* illustrate two electric outputs S arranged on peripheral portions of an edge of external package 8, or arranged substantially in the middle of two opposite edges of external package 8. The number of electric outputs S is not limited to 2; it may be in the range from 1 to N, N being a natural number. Electric outputs S are advantageously randomly distributed on the edges of external package 8 according to the layouts of electric connector pins 32.

As illustrated in FIGS. 19*a* to 19*c* and 20*a* to 20*c*, first surface 8*a* of the external package is advantageously recessed with respect to support member 9 of external package 8 to improve the accessibility of electric outputs S when electric tracks 90 are formed in support member 9 of external package 8.

In an embodiment illustrated in FIGS. 21*a* to 21*c*, sensor 1 advantageously comprises an additional external package 8' enclosing external package 8.

Additional external package 8' comprises:

a first surface 8'*a* and a second opposite surface 8'*b* intended to be respectively connected to hot source Sc and to cold source Sf, a first via 80' connecting said first surface 8'*a* to first surface 8*a* of external package 8, first via 80' directly extending on first surface 8*a* of external package 8, a second via 81' connecting said second surface 8'*b* to second surface 8*b* of external package 8, second via 81' directly extending on second surface 8*b* of external package 8, a support member 9' arranged to support external package 8.

Thus, such an additional external package 8' enables to adapt sensor 1 to the distance separating the hot and cold sources and this, while keeping an already-configured external package 8. Such an adaptation is performed by modifying, in particular, the thickness of vias 80', 81'.

In an embodiment illustrated in FIGS. 22*a* to 22*c*, external package 8 comprises no support member 9.

In an embodiment illustrated in FIGS. 23*a* to 23*c*, first surface 8*a* and second opposite surface 8*b* of external package 8 extend directly on integrated circuit package 6 to obtain as compact a sensor 1 as possible.

Figure 2:
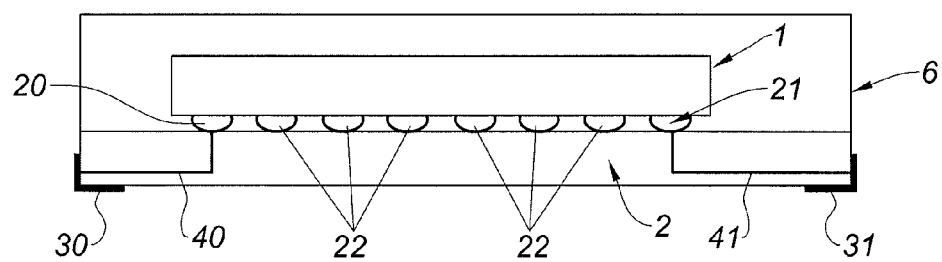
FIG. 2 is a partial simplified side view of a sensor according to an embodiment of the invention.

In an embodiment illustrated in FIGS. 2 and 3, assembly E of thermoelectric layers has a free surface $S_L$, the sensor comprises a first and a second thermally-conductive elements 7*a*, 7*b* facing said free surface $S_L$ and extending at a distance from said free surface $S_L$, and respectively continuing said assembly E on the hot side and on the cold side. In other words, first and second thermally-conductive elements 7*a*, 7*b* top lateral areas of free surface $S_L$ with no direct contact. First and second thermally-conductive elements 7*a*, 7*b* may be made of any thermally-conductive material, as described in document WO 2011012586. First and second thermally-conductive elements 7*a*, 7*b* are advantageously metallic. First and second thermally-conductive elements 7*a*, 7*b* are advantageously made in the form of a metal strip.

In an embodiment, sensor 1 comprises a dielectric layer interposed between substrate 3 and assembly E of thermoelectric layers. When substrate 3 is made of a silicon-based material, the dielectric layer is advantageously $SiO_2$ or $Si_3N_4$. The dielectric layer has a thickness in the range from a few nm to several hundreds of μm.

Figure 25:
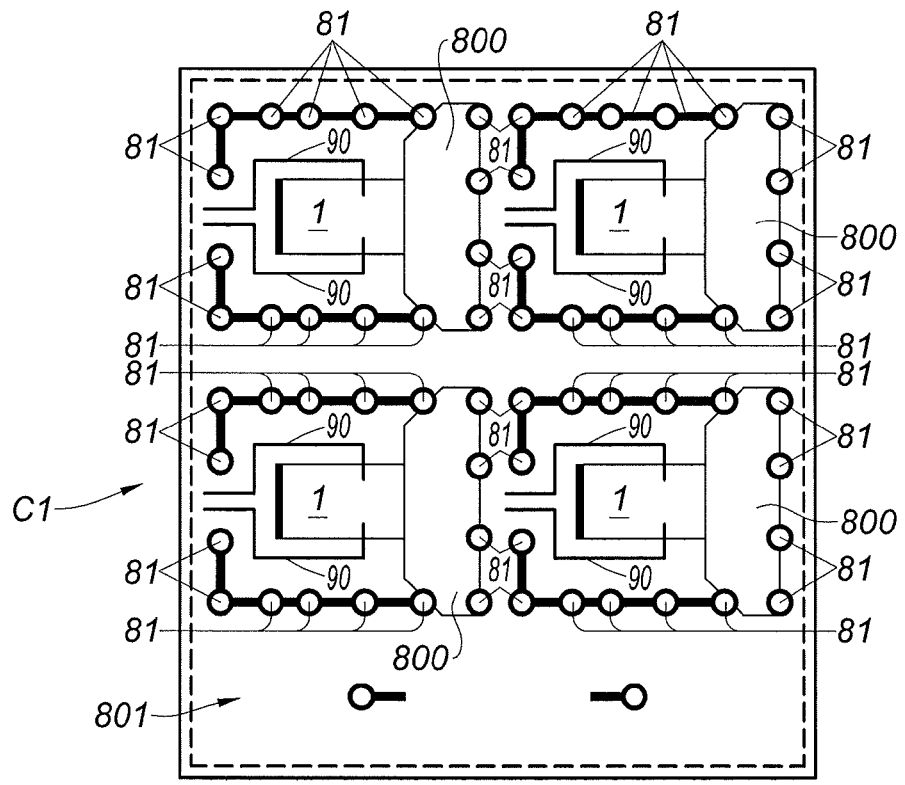
FIG. 25 is a partial top view of the device illustrated in FIG. 24.
Figure 26:
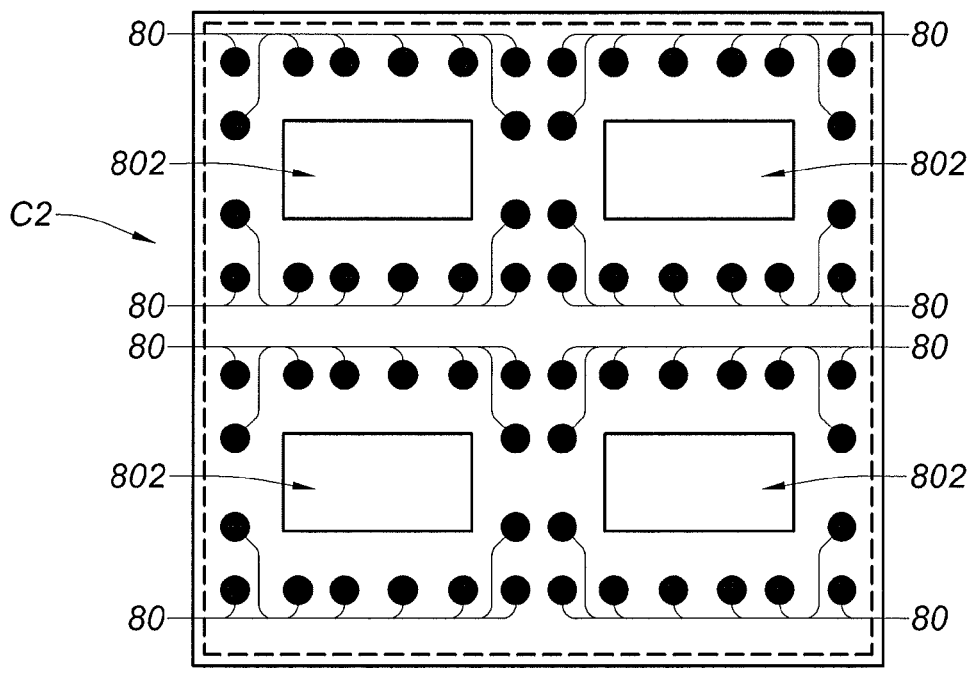
FIG. 26 is a partial top view of the device illustrated in FIG. 24.

FIGS. 24 to 26 illustrate a differential temperature measurement device comprising:

a plurality of sensors 1, a first printed circuit C1, the support member 2 (not shown) of each sensor 1 being formed on first printed circuit C1, a second printed circuit C2 arranged opposite first printed circuit C1 so that first and second printed circuits C1, C2 form the external package 8 enclosing assembly E of thermoelectric layers and the support member 2 of each sensor 1.

First circuit C1 comprises an external surface forming second surface 8b of external package 8. Second circuit C2 comprises an external surface forming first surface 8a of external package 8, first surface 8a and second surface 8b being opposite each other. First circuit C1 comprises at least one via 81 connecting second surface 8b to each connector pin 31 of the support member 2 of each sensor 1. Second circuit C2 comprises at least one via 80 connecting first surface 8a to each first connector pin 30 of the support member 2 of each sensor 1.

The support member 2 of each sensor 1 is advantageously formed on first circuit C1 by soldering, in the same way as a surface mounted device (SMD).

Each circuit C1, C2 is preferably made of a material 801 of FR-4 type (acronym for Flame Resistant 4), comprising a composite of glass fibers and of epoxy resin, tracks 800 of each circuit C1, C2 being preferably made of copper.

First circuit C1 is advantageously planar. First circuit C1 advantageously has a thickness in the range from 100 μm to 5 mm, preferably from 1 mm to 2 mm. The external surface of first circuit C1 forming second surface 8b of external package 8 is advantageously made from a metal plane, for example, made of copper. The copper is advantageously surface-treated by tinning or by nickel-gold deposition.

Second circuit C2 comprises a plurality of cavities 802, each cavity 802 being shaped to receive a sensor 1. The plurality of cavities 802 is preferably obtained by milling. Second circuit C2 advantageously has a thickness greater than the thickness of a sensor 1 by 500 μm. Second circuit C2 preferably has a thickness in the order of 1.6 mm.

Second circuit C2 is advantageously assembled on first circuit C1 via solder paste 220. Solder paste 220 is preferably based on a material selected from the group comprising Au, SnAgAu, SnAgCu. Solder paste 220 is advantageously deposited by silk-screening on first circuit C1. Circuits C1 and C2 are advantageously secured by annealing in a soldering furnace. Then, a so-called underfill polymer may be applied by infiltration to fill possible clearances between circuits C1 and C2 and reinforce of the mechanical behavior of the device.

The invention claimed is:

1. A differential temperature sensor between a hot source and a cold source, including:
    a substrate;
    an assembly of thermoelectric layers arranged on the substrate, the assembly including at least one first junction of a thermocouple on one side of the assembly, called hot side, and at least one second junction of the thermocouple on an opposite side of the assembly, called cold side;
    at least one first connection pad and at least one second connection pad configured to transfer heat respectively to the at least one first junction and to the at least one second junction;
    a thermally-insulating support member configured to support the substrate, said support member including at least one first metal connector pin and at least one second metal connector pin;
    a first metal connector and a second metal connector configured to electrically connect said support member respectively to the at least one first connection pad and to the at least one second connection pad;
    an external package enclosing the assembly of thermoelectric layers and said support member, the external package including:
        a first surface and a second opposite surface intended to be respectively connected to the hot source and to the cold source,
        a first via connecting the first surface to the at least one first metal connector pin,
        a second via connecting the second surface to the at least one second metal connector pin;
    wherein said support member includes:
        a first thermal conductor configured to transfer heat from the at least one first connector pin to the first metal connector, and
        a second thermal conductor configured to transfer heat from the second metal connector to the at least one second connector pin.

2. The sensor according to claim 1, wherein the first surface and the second surface of the external package are coated with a thermally-conductive material.

3. The sensor according to claim 1, including an encapsulation layer arranged on said support member to encapsulate the assembly of thermoelectric layers.

4. The sensor according to claim 1, including an integrated circuit package that encloses the assembly of thermoelectric layers, wherein the integrated circuit package comprises said support member, wherein the external package encloses the integrated circuit package.

5. The sensor according to claim 4, wherein the integrated circuit package includes at least one electric connector pin, and wherein the external package includes at least one electric track extending from the electric connector pin.

6. The sensor according to claim 4, wherein the external package includes a support member configured to support the integrated circuit package.

7. The sensor according to claim 1, wherein the first metal connector and the second metal connector include a solder bump respectively soldered onto the at least one first connection pad and onto the at least one second connection pad to assemble the substrate and said support member.

8. The sensor according to claim 1, wherein the first metal connector and the second metal connector include a bonding wire respectively welded onto the at least one first connection pad and onto the at least one second connection pad to assemble the substrate and said support member.

9. The sensor according to claim 1, wherein the first and the second thermal conductors respectively include:
    at least one first metal track connecting the first metal connector to the at least one first metal connector pin;
    at least one second metal track connecting the second metal connector to the at least one second metal connector pin.

10. The sensor according to claim 1, wherein the assembly of thermoelectric layers has a free surface, wherein the sensor includes a first and a second thermally-conductive elements facing said free surface and extending at a distance from said free surface, and respectively continuing said assembly on the hot side and on the cold side.

11. The sensor according to claim 1, including a dielectric layer interposed between the substrate and the assembly of thermoelectric layers.

12. The sensor according to claim 1, wherein the substrate is made of a thermally-insulating material.

13. A differential temperature measurement device, including:
- a first printed circuit;
- at least one sensor according to claim 1, said support member of the at least one sensor being formed on the first printed circuit;
- a second printed circuit arranged opposite the first printed circuit so that the first and second printed circuits form the external package enclosing the assembly of thermoelectric layers and said support member of the at least one sensor.

\* \* \* \* \*